US006909787B2

(12) United States Patent
Chen

(10) Patent No.: US 6,909,787 B2
(45) Date of Patent: Jun. 21, 2005

(54) METHOD AND RELATED APPARATUS FOR STEREO VOCAL CANCELLATION

(75) Inventor: Ken-Chi Chen, Taipei (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 89 days.

(21) Appl. No.: 10/707,415

(22) Filed: Dec. 12, 2003

(65) Prior Publication Data

US 2005/0041814 A1 Feb. 24, 2005

(30) Foreign Application Priority Data

Aug. 21, 2003 (TW) ....................................... 92123071 A

(51) Int. Cl.$^{7}$ ............................ H04R 5/00; H03G 3/00; H03G 5/00; A63H 13/00

(52) U.S. Cl. ............................... 381/17; 381/2; 381/98; 381/61; 381/27; 84/609

(58) Field of Search ...................... 381/27, 307, 98–99, 381/61, 1–23, 119; 84/609; 700/94; 704/205; 434/307 A

(56) References Cited

U.S. PATENT DOCUMENTS 6,522,751 B1 * 2/2003 Iwase et al. .................. 381/17

* cited by examiner

*Primary Examiner*—Laura A. Grier
(74) *Attorney, Agent, or Firm*—Winston Hsu

(57) ABSTRACT

Method and related apparatus for canceling vocal portions containing in two signals of two stereo channels and providing two corresponding output signals. The method includes: generating a mono signal according to a sum of the signals of the stereo channels; respectively performing vocal cancellation to each signal of one stereo channel according to a difference between the signal of the stereo channel and the mono signal, and performing low-frequency band and high-frequency band compensation to results of vocal cancellation to generate the two output signals. Because vocal cancellation is performed for respective signal of one stereo channel, the two output signals will have substantial difference in frequency band other than the high-frequency band to increase effect of stereo.

12 Claims, 6 Drawing Sheets

100

```
void Vocal_cancel(int j)
{
  Mono[j]=(x_L[j]+x_R[j])/2;

  Hi_Pass(x_L[j],h_L[j]);
  Hi_Pass(x_R[j],h_R[j]);

  Low_Pass(x_R[j],low[j]);

  L_out[j]=(h_L[j]+x_L[j]-Mono[j]+low[j]);
  R_out[j]=(h_R[j]+x_R[j]-Mono[j]+low[j]);
}
```

Fig. 6

METHOD AND RELATED APPARATUS FOR STEREO VOCAL CANCELLATION

BACKGROUND OF INVENTION

1. Field of the Invention

The present invention relates to a method and related apparatus for stereo vocal cancellation, and more particularly, to a method and related apparatus, which cancels vocals of different stereo signals respectively.

2. Description of the Prior Art

With advanced information and electronics technology, various types of entertainment systems are available. For example, karaoke systems can play background music filtered of vocals, allowing users to sing along and enjoy a professional entertainment environment. However, music provided at retail outlets generally includes vocals, so in order to meet the requirements of an accompaniment system vocal cancellation technology is used, which aims to attenuate the vocals and leave the background music intact.

Please refer to FIG. 1. FIG. 1 shows a block diagram of a player 10 that performs vocal cancellation according to the prior art. In general, modern systems can play two-channel (or more) stereo sound, with different speaker modules of the player outputting the different stereo signals to allow users to hear realistic sound. The player 10 has a sound source circuit 12 to provide two stereo signals (such as left and right stereo signals), a signal module 14 to perform vocal cancellation, and two speaker modules 16A, 16B to output the stereo sound. The sound source circuit 12 can be a CD reading mechanism, which utilizes a reading head 18 to access and data of a CD 20 to demodulate it. The CD 20 has music data of two stereo channels, so the sound source circuit 12 reads two stereo signals PLi, PRi after accessing the data of CD 20. The signal module 14 performs vocal cancellation for the stereo signals PLi, PRi to generate two output signals PLo, PRo. The speaker modules 16A, 16B have individual A/D converters, power amplifiers, and speakers to transform the output signals PLo, PRo into acoustic waves.

In order to perform vocal cancellation, the signal module 14 has two high pass modules 26A, 26B, a low pass module 28, and a vocal cancellation module 22. The high pass modules 26A, 26B high pass filter the stereo signals PLi, PRi to generate two corresponding high pass signals PLh, PRh; and the low pass module 28 filters a signal Ps to generate a corresponding low pass signal P1. The vocal cancellation module generates an intermediate signal PVC by the difference between the two stereo signals PLi, PRi. The output signal PLo is generated by mixing a sum of the high pass signal PLh corresponding to the stereo signal PLi, the low pass signal P1, and the intermediate signal PVC. The output signal PRo is generated by mixing a sum of the high pass signal PRh corresponding to the stereo signal PRi, the low pass signal P1, and the intermediate signal PVC.

To illustrate vocal cancellation of the mentioned prior art, please refer to FIG. 2. FIG. 2 shows the spectrum of each stereo signal, with each horizontal axis of the spectrum being frequency, and each vertical axis of the spectrum being amplitude.

Generally speaking, commercially produced music establishes stereo sound by mixing different signals of background music. The vocal track is mixed into each stereo signal with equal intensity. When a user plays the stereo signals with the speaker modules, they hear the vocals as being ahead because the components of the two stereo channels are equal. Different kinds of background music in each of the stereo channels makes the user hear the stereo effect, as if the background music is around the user. In FIG. 2, a spectrum Vf represents the vocal spectrum, and spectrums Lmf, Rmf individually represent the different spectrums of background music. As mentioned above, the sum of the background music spectrum Lmf and the vocal spectrum Vf generates a spectrum of a left stereo signal Lf, and the sum of the background music spectrum Rmf and the vocal spectrum Vf generates a spectrum of a right stereo signal Rf. Like the stereo signals PLi, PRi accessed from the sound source circuit 12 in FIG. 1, their spectrums may be shown as the spectrums Lf, Rf. Because of the physical limitation of the human voice, which produces vocals not below a specific low frequency or exceeding a specific high frequency, the vocal spectrum is usually limited to a specific bandwidth. The frequencies fl, fh denoted in FIG. 2 individually represent the lower bound and the upper bound of the human vocal spectrum. The vocal spectrum Vf is concentrated on the intermediate-frequency band BM between the frequencies fl and fh. In contrast to the vocal spectrum Vf limited to the intermediate-frequency band BM, the spectrum of background music produced by all kinds of musical instruments is of a broader bandwidth. Shown in FIG. 2, the spectrums Lmf, Rmf of background music spread into the low-frequency band BL below the frequency f1, and into the high-frequency band BH above the frequency fh. In addition to the intermediate-frequency band BM that the vocal spectrum is located in, each signal spectrum of the stereo channel Lf, Rf is also expanded into the low-frequency band BL and the high-frequency band BH.

Because each stereo signal has the same vocal signals, the signal module 14 (please refer to FIG. 1) subtracts the stereo signal PRi from the stereo signal PLi in the vocal cancellation module 22 to remove the common vocals of the two stereo signals and generate the intermediate signal PVC. The stereo signals PLi, PRi located in the low-frequency band BL and the high-frequency band BH are reduced in the subtraction process, and the vocal cancellation should contain the components of background music in the low-frequency band BL and the high-frequency band BH. Thus, the signal module 12 uses the high pass modules 26A, 26B and the low pass module 28 to perform high-frequency compensation and low-frequency compensation. The high pass module 26A extracts the components of the stereo signal PLi in the high frequency band BH to generate the high pass signal PLh. The signal source Ps of the low pass module 28 may be one of the stereo signals PLi, PRi. The low pass module 28 extracts the component of the signal Ps in the low-frequency band BL to generate the low pass signal P1. The mixing sum of the high pass signal PLh, the low pass signal Pl, and the intermediate signal PVC can compensate for the high and low-frequency components lost in the vocal cancellation to generate the output signal PLo.

In the same way, after the high pass module 26B extracts the high-frequency components of the stereo signal PRi to generate the high pass signal PRh, the signal module 12 can use the high pass signal PRh and the low pass signal P1 to perform high and low-frequency compensations for the intermediate signal PVC in order to generate the output signal PRo. In general, each stereo signal in the low-frequency band BL does not have direction, so it is difficult to build the stereo sound effect by the difference of the stereo signals PRi, PLi in the low-frequency band. Thus, the signal module 14 uses the same low-frequency signal P1 to perform low-frequency compensation for the output signals PLo, PRo. In contrast, each stereo signal in the high-frequency band BH has direction, and the difference of the stereo signals in the high-frequency band BH allows the user to hear the stereo sound effect. Thus, the signal module 14 individually uses the high pass signals PRh, PLh, high pass filtered by the two stereo signals PRi, PLi, to perform high pass compensation, as well as utilizing the difference of the output signals PRo, PLo in the high-frequency band to produce the stereo sound effect. In summary, the signal module 14 receives two stereo signals PLi, PRi, uses the vocal cancellation module 22 to generate the intermediate signal PVC as the essential result of vocal cancellation, uses the low pass signal Pl and the high pass signals PLh, PRh as the low and high-frequency compensations respectively, and individually generates the output signals PLo, PRo as the results of the stereo signals PLi, PRi after vocal cancellation. The signal module 12 attenuates the vocals of the two stereo signals while somewhat preserving the stereo sound effect of the background music in the output signals PLo, PRo.

Please refer to FIG. 3. FIG. 3 shows the spectrum when the signal module 14 of FIG. 1 operates. In FIG. 3, each horizontal axis is frequency and the vertical axis is magnitude. Continuing the spectrum example in FIG. 2, if the spectrums of the stereo signals PLi, PRi in FIG. 1 are the spectrums Lf, Rf in FIG. 2, after the signal module 14 operates the spectrums of the output signals PLo, PRo are as the spectrums PLof, PRof in FIG. 3. The frequencies fl, fh, the low-frequency band BL, the intermediate-frequency band BM, and the high-frequency band BH denoted in FIG. 3 are the same as those of FIG. 2. To compare the difference of two spectrums PLof and PRof, FIG. 3 illustrates the spectrum PRof with a dotted line and the spectrum PLof with a solid line.

Because the output signals PLo and PRo generated by the signal module 14 in FIG. 1 have the same intermediate signal PVC and the same low pass signal Pl, the different parts are the different high pass signals PLh, PRh for high pass compensation. Compared with the spectrums PLof, PRof of the output signals PLo, PRo in FIG. 3, the main difference is concentrated in the high-frequency band BH, the components of the intermediate-frequency band BM and the low-frequency band BL of two spectrums PLof, PRof being the same. Although the high-frequency components of the signals have the stereo sound effect, most of the energy of the spectrums PLof, PRof is concentrated in the intermediate-frequency and low-frequency bands BM, BL. The signal energy distributed in the high-frequency band BH is relatively low, which results in little difference between the spectrums PLof, PRof. As such, when the player 12 outputs the output signals PLo, PRo, the stereo sound effect is not as expected. This is one disadvantage of the prior art. In other words, in the prior signal module 14 of FIG. 1, the output signals PLo, PRo of the two stereo channels both use the same intermediate signal PVC as the essential signal of vocal cancellation, and only use the different high pass signals PLh, PRh as the high pass compensation. The difference of the output signals PLo, PRo in only concentrated in the high-frequency and less-energy portions, and is not significant enough to generate an obvious stereo effect. This reduces stereo sound effect quality, and lessens user enjoyment.

SUMMARY OF INVENTION

It is therefore a primary objective of the claimed invention to provide an improved method and related apparatus of vocal cancellation that leaves the stereo signal difference intact to generate better stereo sound after vocal cancellation to solve the above-mentioned problem.

In the prior art, an intermediate signal generated by two stereo signals is the main signal of vocal cancellation. With the intermediate signal, the output signals of two stereo channels are generated after low-frequency compensation and separate high-frequency compensations. Because the output signals of two stereo channels have the same intermediate signal, the difference of them is limited only to the high-frequency components, resulting in low-quality stereo sound.

According to the claimed invention, the average of two stereo signals generates a mono signal, and the difference between each stereo signal and the mono signal is the corresponding intermediate signal of vocal cancellation of each stereo signal. The low-frequency compensation and the corresponding high-frequency compensation for the corresponding intermediate signal of each stereo signal generate the corresponding output signal. In this method, the corresponding intermediate signal of each stereo signal is generated by the difference between the stereo signal and the mono signal, so the corresponding intermediate signal of each output stereo signal is also different. Even after vocal cancellation, the differences of each stereo signal in the low-frequency and intermediate-frequency bands are preserved, which makes the output signals have an improved stereo sound effect allowing users to better enjoy the accompaniment of stereo sound.

These and other objectives of the claimed invention will no doubt become obvious to those of ordinary skill in the art after reading the following detailed description of the preferred embodiment that is illustrated in the various figures and drawings.

BRIEF DESCRIPTION OF DRAWINGS

FIG. 6 is a program code to implement the signal module of FIG. 4.

DETAILED DESCRIPTION

Figure 4:
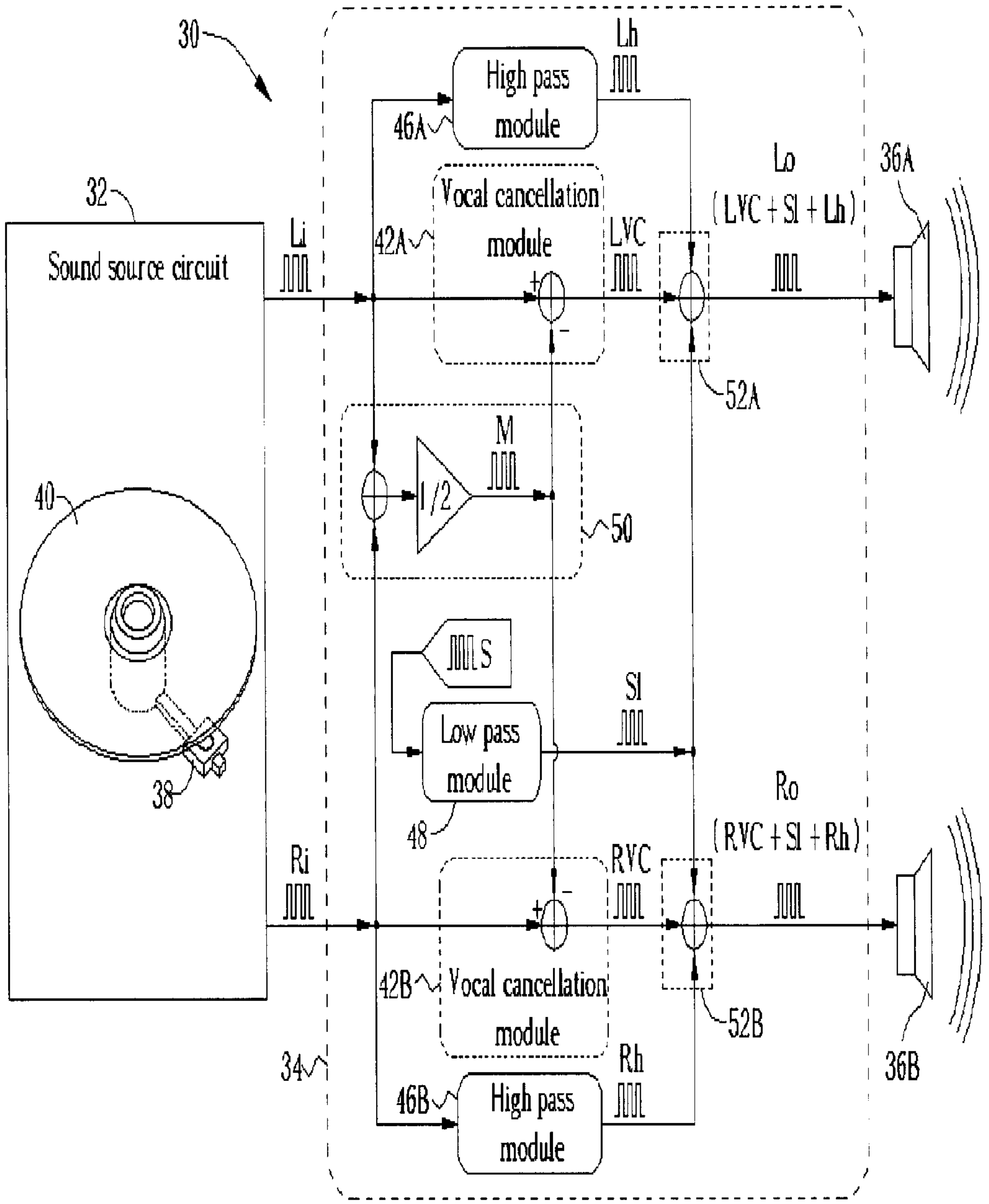
FIG. 4 is a block diagram of a player capable of vocal cancellation according to the present invention.

Please refer to FIG. 4. FIG. 4 is a block diagram of a player 30 capable of vocal cancellation according to the present invention. The player 30 has a sound source circuit 32, a signal module 34, and two speaker modules 36A, 36B to play stereo sound. The sound source circuit 32 is a CD read mechanism, utilizing a read head 38 to read the signal data from a CD 40, as well as processing the signal data to output each stereo signal Li, Ri. The signal module 34 is used to realize vocal cancellation of the present invention, outputting two output signals Lo, Ro having vocals cancelled according to two stereo signals Li, Ri. The signal module 34 has a mono processing module 50 and a low pass module 48. To match two stereo signals Li and Ri, the signal module 34 also has two vocal cancellation modules 42A, 42B and two high pass modules 46A, 46B. The speaker modules 36A, 36B have individual D/A converters, power amplifiers, and speakers to transform the output signal Lo, Ro into acoustic waves.

The process of vocal cancellation with the signal module 34 according to the present invention is described as follows. The mono processing module 50 of the signal module 34 can calculate the average of the stereo signals Li, Ri to generate a mono signal M, such that M=(Li+Ri)/2. The present invention utilizes the mono signal M to perform vocal cancellation for each stereo signal. In the vocal cancellation module 42A corresponding to the stereo signal Li, the stereo signal Li minus the mono signal M generates the mediate signal LVC (LVC=Li−M). In the vocal cancellation module 42B corresponding to the stereo signal Ri, the difference of the stereo signal Ri and the mono signal M generates the intermediate signal RVC (RVC=Ri−M).

Figure 1:
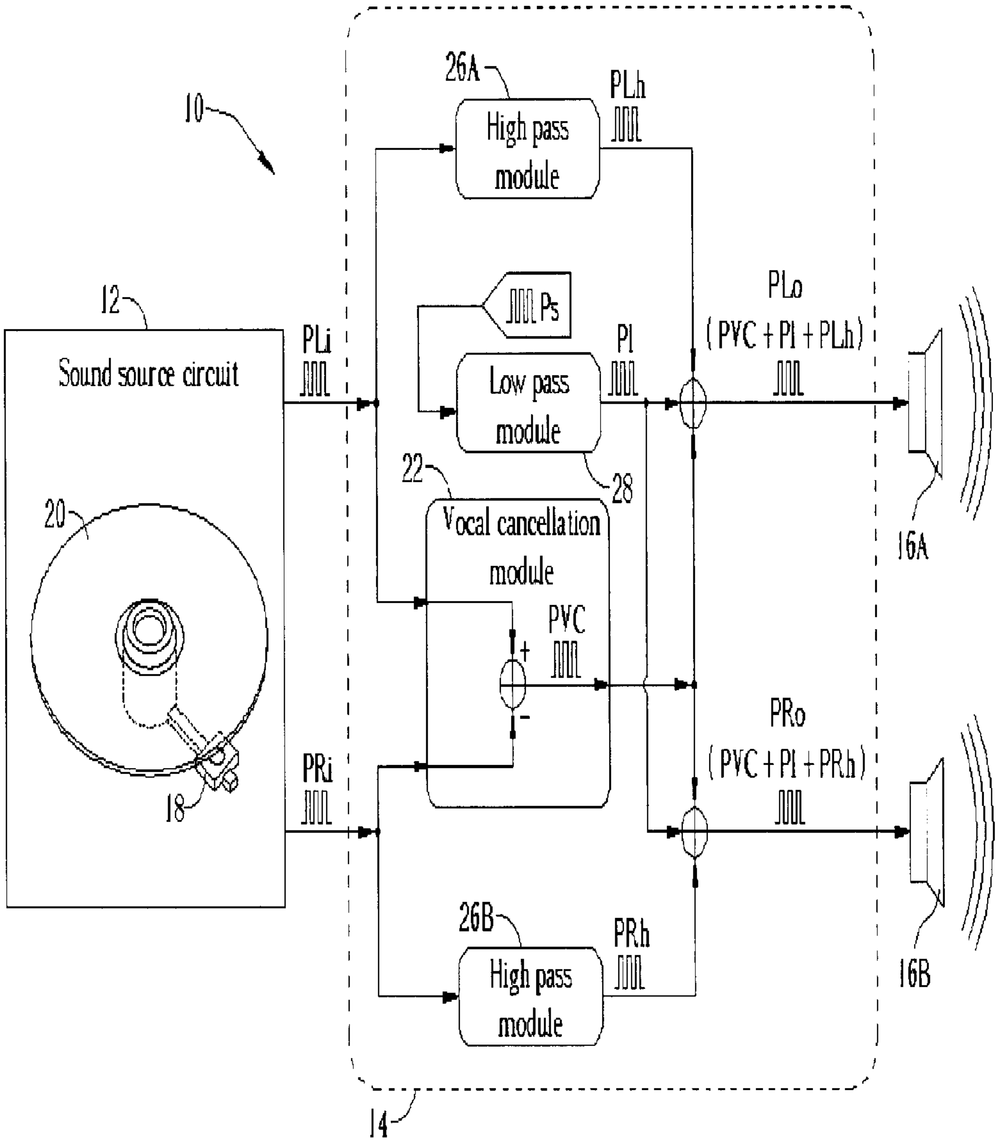
Fig. 1 Prior art
FIG. 1 is a block diagram of a prior art music player adapted to vocal cancellation.
Figure 2:
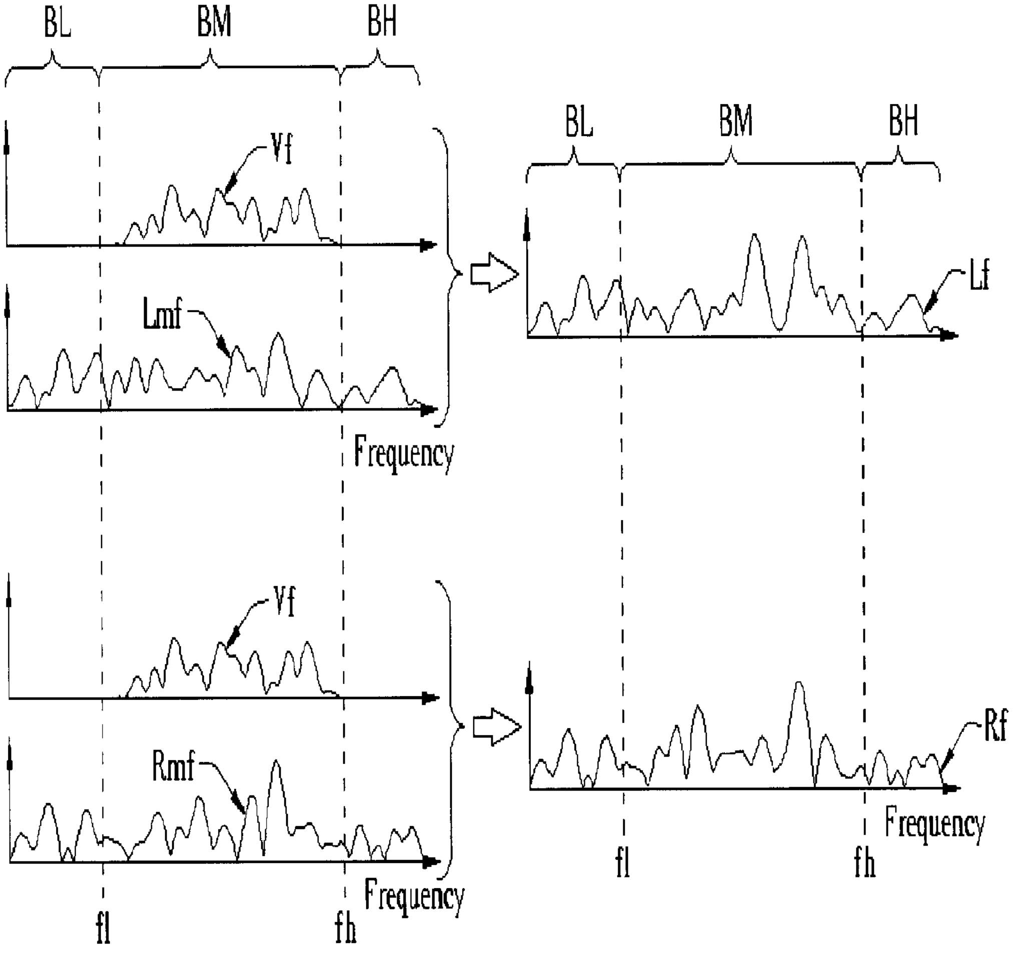
Fig. 2 Prior art
FIG. 2 is a spectrum diagram of each stereo signal of the player of FIG. 1.
Figure 3:
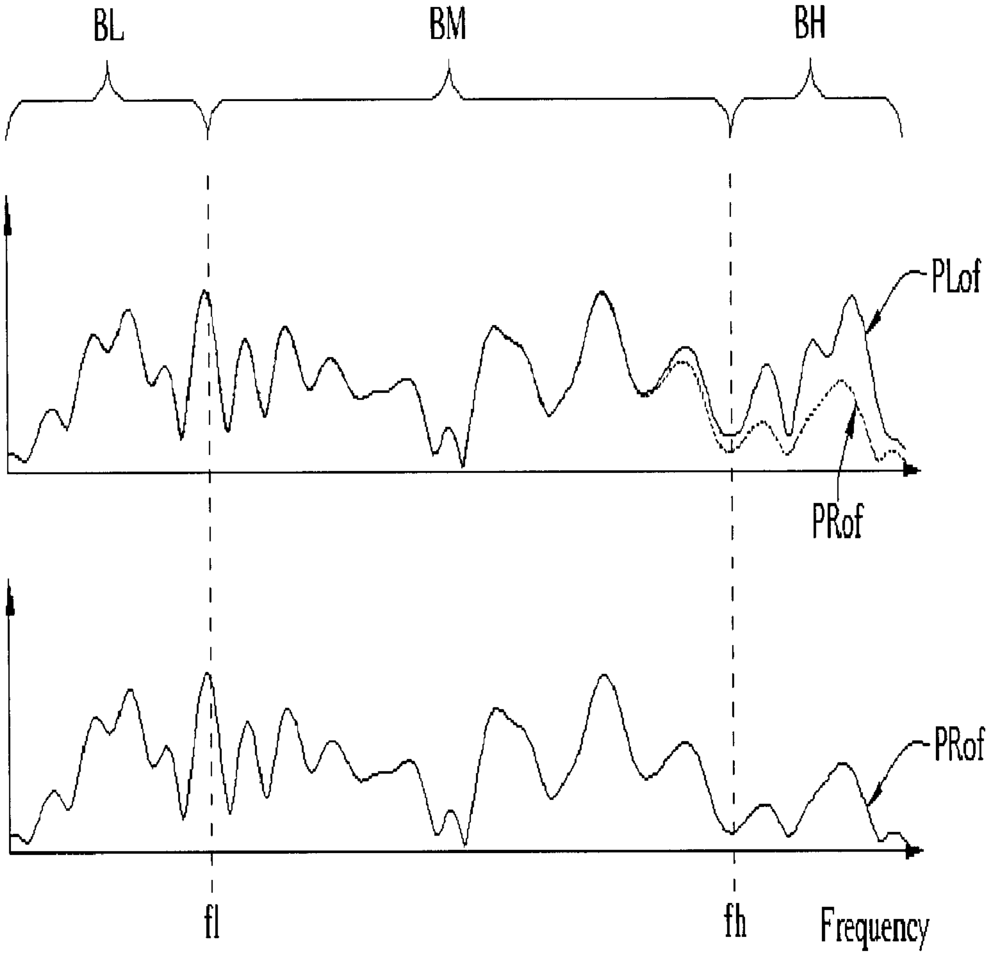
FIG. 3 is a spectrum diagram of each output signal of the player of FIG. 1.

As illustrated in FIG. 2, the vocal signal is usually mixed into the stereo signal with equal magnitude. In the present invention, the mono signal generated by the average of the stereo signals Li, Ri has the same vocals as that of each stereo signal. The present invention utilizes each vocal cancellation module corresponding to each stereo signal to subtract the mono signal from each stereo signal, individually performing vocal cancellation for each stereo signal. The difference from the prior art is that the present invention individually performs vocal cancellation according to each stereo signal, so the corresponding intermediate signals generated by different stereo signals after vocal cancellation are different. Referring to the example of FIG. 4, the intermediate signal LVC of the stereo signal Li after vocal cancellation is equal to Li−M, and the other intermediate signal RVC of the stereo signal Ri after vocal cancellation is equal to Ri−M and is different from the intermediate signal LVC. As the discussed above, the stereo sound effect is caused by the difference of the stereo signals. In the present invention, the signal difference of the stereo sound effect generated by the stereo signals Li and Ri is preserved in the intermediate signals LVC and RVC. The present invention mainly utilizes the signal difference of the intermediate signals LVC and RVL to generate improved vocal-cancelled stereo sound compared to the prior art. Note that in the prior technology of vocal cancellation shown as FIG. 1, the different stereo signals use the same vocal cancellation module to perform vocal cancellation with the same intermediate signal as the essential result of vocal cancellation. Compared with the prior art, the present invention individually performs vocal cancellation according to the different stereo signals, which further preserves the signal difference of each stereo signal to better reproduce the stereo effect.

As shown in FIG. 4, after generating the intermediate signals LVC and RVC according to the stereo signals Li and Ri, the signal module 34 can perform high-frequency and low-frequency compensation according to the intermediate signals LVC and RVC to generate the output signals Lo and Ro. The high pass module 46A can extract the portion of the stereo signal Li in the high-frequency band (mainly the portion higher than the intermediate-frequency vocal band, please refer to FIG. 2 and the related description) as the high pass signal Lh. The low pass module 48 can extract the portion of the signal S in the low-frequency band as the low pass signal S1. The signal S can be one of the stereo signals Li and Ri, or the mono signal M. Mixing the high pass signal Lh corresponding to the stereo signal Li, the intermediate signal LVC, and the low pass signal S1 with the mixing unit 52A is equal to high and low-frequency compensation for the intermediate signal LVC, the mixing unit 52A also generating the output signal Lo corresponding to the stereo signal Li (Lo=LVC+Sl+Lh). In the same way, the high pass module 46B can extract the portion of the stereo signal Ri in the high-frequency band as the high pass signal Rh, which allows high-frequency compensation for the intermediate signal RVC. Mixing the high pass signal Rh corresponding to the stereo signal Ri, the intermediate signal RVC, and the low pass signal S1 with the mixing unit 52B is equal to high and low-frequency compensation for the intermediate signal RVC, the mixing unit 52B also generating the output signal Ro corresponding to the stereo signal Ri (Ro=RVC+Sl+Rh).

Figure 5:
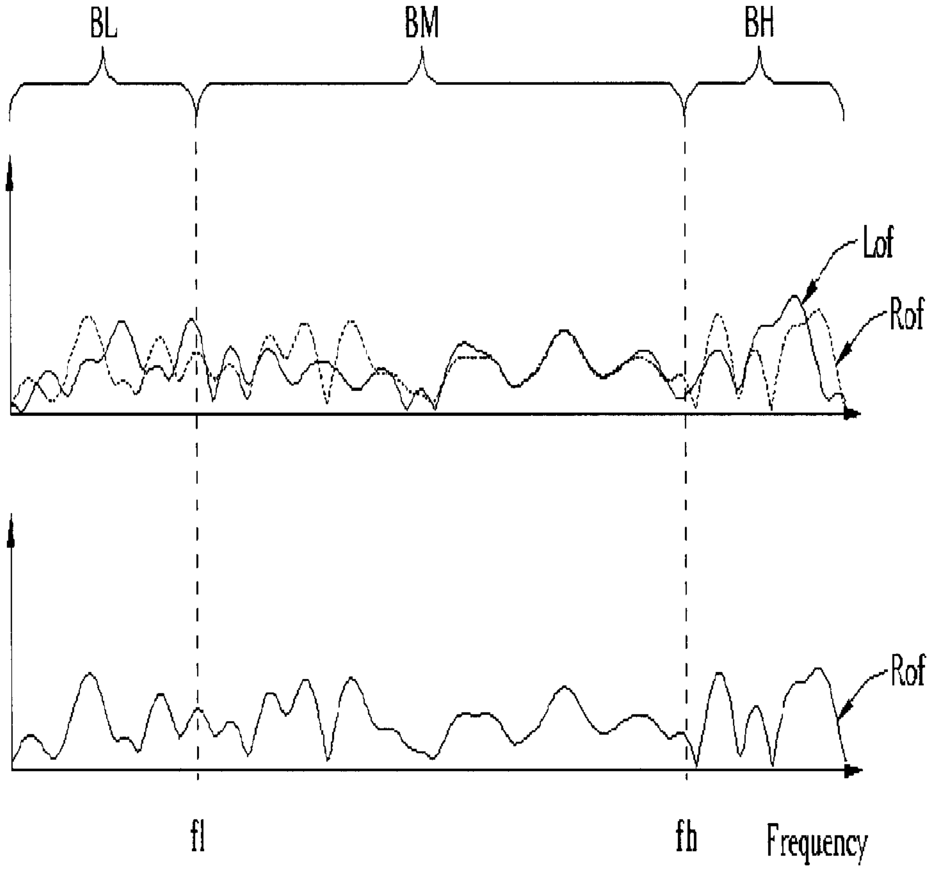
FIG. 5 is a spectrum diagram of each output signal of the player of FIG. 4.

Please refer to FIG. 5. FIG. 5 shows the spectrum of the output signals Lo and Ro generated by the operation of the signal module 34 according to the present invention. The horizontal axis in FIG. 5 is frequency, and the vertical axis is magnitude. To continue the example in FIG. 2, if the spectrums of the stereo signals Li, Ri in FIG. 4 are shown as the spectrums Lf, Rf in FIG. 2, the spectrums of the output signals Lo, Ro of the present invention are shown as the spectrums Lof, Rof in FIG. 5 (the spectrum Rof is a dotted line and the spectrum Lof is a solid line, and the frequencies fl, fh and the frequency bands BL, BM, BH in FIG. 2 are also shown in FIG. 5). In FIG. 5, the present invention individually performs vocal cancellation according to the different stereo signals, so the differences of the stereo signals distributed in the low-frequency band BL and the intermediate-frequency band BM are also preserved between the output signals Lo and Ro. This makes the output signals Lo, Ro of the present invention different not only in the high-frequency band BH but also in the low and intermediate-frequency bands. As a result, when the player 30 of the present invention outputs the output signals Lo, Ro with the speaker modules 36A, 36B, users can hear more abundant accompaniment with a more pronounced stereo sound effect and enjoy an improved accompaniment environment.

Each functional block of the signal module 34 of the present invention in FIG. 4 can be implemented in the form of hardware, firmware, and/or software. For example, general players have programmable signal processing circuits, and the present invention can be implemented by firmware storing program code in the player memory. When the signal processing circuit executes such program code, vocal cancellation according to the present invention is effected. In addition, the present invention can be implemented to cancel vocals and offer background music in the form of software, such as the computer music playing programs, which usually cooperate with peripheral apparatuses (such as sound cards and CD players) to play music. Please refer to FIG. 6. A program code 100 is used to implement vocal cancellation according to the present invention. The array variables x__L and x__R are used to represent the different stereo signals Li and Ri (as in FIG. 4), and the array variable Mono represents the mono signal M. A subroutine Hi__Pass is used to implement the high pass modules, while a subroutine Low__Pass is used to implement the low pass modules. The array variables h__L and h__R individually represent the high pass signals Lh and Rh, the array variable low represents the low pass signal Sl, and the array variables L__out and R__out individually represent the output signals Lo and Ro. The integer pointer j of program code 100 represents the j-th value of a variable array, and it also corresponds to the j-th sample of the corresponding signal of the variable array. Shown in the program code 100, the mono signal represented by the variable Mono is the average of the variables x__L and x__R that correspond to each stereo signal, the high pass filtered results of the variables x__L and x__R are individually stored in the variables h__L and h__R. The stereo signal Ri represented by the variable x__R is the signal S in FIG. 4, and the low pass signal Sl generated by low pass filter is represented by the variable low. Finally, the intermediate signals LVC and PVC are individually implemented by an operation x__L[j ]−Mono[j ] and x__R[j ]−Mono[j ] of the program code 100. The sum of the intermediate signals, the variable of low-frequency compensation low, and the variables of high-frequency compensation h__L and h__R can generate the output signals of vocal cancellation according to the present invention, which are individually stored in the variables L__out and R__out.

In vocal cancellation of the prior art, because the output signals of the different stereo channels use the same intermediate signal as the main result of vocal cancellation, the signal difference of the output signals in the low and mediate-frequency bands outside the high-frequency band is not clear to a listener. Thus, the output signal of each stereo channel in the prior art does not produce a stereo sound effect of suitable quality. Compared with the prior art, the present invention individually performs corresponding vocal cancellation according to the different stereo signals, so the output signal of each stereo channel preserves the whole signal difference. When the different speaker modules output the output signals, an improved stereo sound effect can be heard allowing users to better enjoy the accompaniment. In addition to typical CD players, the present invention can apply to other types of players, such as network modules that play music through a wired or wireless network.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method for stereo vocal cancellation, the method outputting a first output signal and a second output signal according to a first stereo signal of a first stereo channel and a second stereo signal of a second stereo channel respectively; the method comprising:

generating a mono signal according to a sum of the first stereo signal and the second stereo signal;

high pass filtering the first stereo signal to generate a corresponding first high pass signal according to a high-frequency band, the frequency of the first high pass signal being substantially concentrated on the high-frequency band;

high pass filtering the second stereo signal to generate a corresponding second high pass signal according to the high-frequency band, the frequency of the second high pass signal being substantially concentrated on the high-frequency band;

generating a first intermediate signal according to a difference between the first stereo signal and the mono signal;

generating a second intermediate signal according to a difference between the second stereo signal and the mono signal;

mixing the first intermediate signal and the first high pass signal to generate the first output signal; and mixing the second intermediate signal and the second high pass signal to generate the second output signal;

wherein the first output signal and the second output signal have substantial differences outside the high-frequency band.

2. The method of claim 1 further comprising:

generating a low pass signal according to a low-frequency band, the frequency of the low pass signal being substantially concentrated on the low-frequency band;

wherein when generating the first output signal, further mixing the low pass signal with the first intermediate signal and the first high pass signal; and when generating the second output signal, further mixing the low pass signal with the second intermediate signal and the second high pass signal.

3. The method of claim 2 wherein the low pass signal is generated according to the low-frequency band, the low pass signal being generated by low pass filtering the first stereo signal or the second stereo signal according to the low-frequency band.

4. The method of claim 2 wherein the low pass signal is generated according to the low-frequency band, the low pass signal being generated by low pass filtering the mono signal according to the low-frequency band.

5. The method of claim 1 wherein the bandwidth of the high-frequency band is higher than the bandwidth of a vocal track of the first or second stereo signal.

6. A player comprising:

a sound source circuit for providing a first stereo signal of a first stereo channel and a second stereo signal of a second stereo channel; and a signal module for performing vocal cancellation on the first stereo signal and the second stereo signal and generating a first output signal and a second output signal respectively; the signal module comprising:

a mono process module for generating a mono signal according to a sum of the first stereo signal and the second stereo signal;

a first high pass module for high pass filtering the first stereo signal according to a high-frequency band to generate a corresponding first high pass signal, the frequency of the first high pass signal being substantially concentrated on the high-frequency band;

a second high pass module for high pass filtering the second stereo signal according to the high-frequency band to generate a corresponding second high pass signal, the frequency of the second high pass signal being substantially concentrated on the high-frequency band;

a first vocal cancellation module for generating a first intermediate signal according to a difference between the first stereo signal and the mono signal;

a second vocal cancellation module for generating a second intermediate signal according to a difference between the second stereo signal and the mono signal;

a first mixing unit for generating the first output signal by mixing the first intermediate signal and the first high pass signal; and a second mixing unit for generating the second output signal by mixing the second intermediate signal and the second high pass signal;

wherein the first output signal and the second output signal have substantial differences outside the high-frequency band.

7. The player of claim 6 further comprising:

a low pass module for generating a low pass signal according to a low-frequency band, the frequency of the low pass signal being substantially concentrated on the low-frequency band;

wherein the first mixing unit is for mixing the first intermediate signal, the first high pass signal, and the low pass signal to generate the first output signal; and the second mixing unit is for mixing the second intermediate signal, the second high pass signal, and the low pass signal to generate the second output signal.

8. The player of claim 7 wherein the low pass module low pass filters the first stereo signal or the second stereo signal according to the low-frequency band to generate the low pass signal.

9. The player of claim 7 wherein the low pass module low pass filters the mono signal according to the low-frequency band to generate the low pass signal.

10. The player of claim 6 wherein the bandwidth of the high-frequency band is higher than the bandwidth of a vocal track of the first or second stereo signal.

11. The player of claim 6 wherein the sound source circuit reads signals of a CD to form the first stereo signal and the second stereo signal.

12. The player of claim 6 further comprising:

a first speaker module for transforming the first output signal to acoustic waves; and a second speaker module for transforming the second output signal to acoustic waves.

* * * * *